(12) United States Patent
Bandyopadhyay

(10) Patent No.: US 9,564,916 B2
(45) Date of Patent: Feb. 7, 2017

(54) SUPPRESSING SIGNAL TRANSFER FUNCTION PEAKING IN A FEEDFORWARD DELTA SIGMA CONVERTER

(71) Applicant: ANALOG DEVICES, INC., Norwood, MA (US)

(72) Inventor: Abhishek Bandyopadhyay, Winchester, MA (US)

( * ) Notice: Subject to any disclaimer, the term of this patent is extended or adjusted under 35 U.S.C. 154(b) by 0 days.

(21) Appl. No.: 15/067,847

(22) Filed: Mar. 11, 2016

(65) Prior Publication Data
US 2016/0359499 A1    Dec. 8, 2016

Related U.S. Application Data

(63) Continuation of application No. 62/170,135, filed on Jun. 3, 2015.

(51) Int. Cl.
*H03M 3/00* (2006.01)

(52) U.S. Cl.
CPC ............ *H03M 3/422* (2013.01); *H03M 3/30* (2013.01); *H03M 3/458* (2013.01)

(58) Field of Classification Search
CPC ......... H03M 3/422; H03M 3/30; H03M 3/458
USPC ................................................ 341/143, 155
See application file for complete search history.

(56) References Cited

U.S. PATENT DOCUMENTS

| | | | |
|---|---|---|---|
| 6,556,158 B2 * | 4/2003 | Steensgaard-Madsen | H03M 3/416 341/131 |
| 7,554,474 B2 * | 6/2009 | Le Guillou | H03M 3/30 341/143 |
| 8,120,518 B2 * | 2/2012 | Jang et al. | H03M 3/42 341/143 |
| 8,643,524 B1 | 2/2014 | Zanbaghi | |
| 9,035,814 B2 * | 5/2015 | Chang | H03M 3/30 341/143 |
| 2005/0068213 A1 | 3/2005 | Fontaine et al. | |
| 2007/0018865 A1 | 1/2007 | Chang et al. | |
| 2008/0062022 A1 | 3/2008 | Melanson | |

(Continued)

OTHER PUBLICATIONS

Ahmed Gharbiya et al., *On The Implementation of Input-Feedforward Delta-Sigma Modulators*, IEEE Transactions on Circuits and Systems—II: Express Briefs, vol. 53, No. 6, Jun. 2006, 5 pages.

(Continued)

*Primary Examiner* — Brian Young
(74) *Attorney, Agent, or Firm* — Patent Capital Group

(57) ABSTRACT

A modified topology for a CTDSM (referred herein as "SCFF") can effectively deal with signal transfer function (STF) peaking, an inherent property of continuous time feedforward delta sigma converters. The SCFF approach involves providing an additional digital-to-analog (DAC) feedback path to the input of the second integrator (incurring an additional DAC in the circuitry, converting the output of the quantizer into an analog signal and feeding the analog signal to the input of the second integrator). Furthermore, the SCFF approach involves providing two feed-ins: a first feed-in to the input of the second integrator and a second feed-in to the input of the third integrator. The first feed-in can be negative. Advantageously, the modified continuous time delta sigma modulator implementing this approach alleviates some of the peaking issues in the signal transfer function while still enjoy low power consumption.

20 Claims, 12 Drawing Sheets

(56) References Cited

U.S. PATENT DOCUMENTS

2011/0075775 A1 3/2011 Coban et al.
2011/0156940 A1 6/2011 Le Guillou et al.

OTHER PUBLICATIONS

Mattias Andersson, *Continuous-Time Delta-Sigma Modulators for Wireless Communication*, Lund Institute of Technology, Lund University, Doctorial Disseration, Lund, Mar. 2014, 141 pages.
Vishal Saxena, *Delta-Sigma Analog-to-Digital Converters—From System Architecture to Transistor-level Design*, Boise State University, IEEE MWSCAS, Aug. 5, 2012, 77 pages.
Richard Schreier, *The Delta-Sigma Toolbox Version 7.3*, Analog Devices, Inc., Jul. 3, 2009, 40 pages.
Y. Le Guillou et al., *Elliptic Filtering in Continuous-Time Sigma-Delta Modulator*, Electronic Letters, $17^{th}$ Feb. 2005, vol. 41, No. 4, 2 pages.
Li Hongyi et al., *An Improved Single-Loop Sigma-Delta Modulator for GSM Applications*, Journal of Semiconductors, vol. 32, No. 9, Sep. 2011, 8 pages.
Hyungseok Kim et al., *Adaptive Blocker Rejection Continuous-Time ΣΔ ADC for Mobile WiMAX Applications*, IEEE Journal of Solid-State Circuits, vol. 44, No. 10, Oct. 2009, 14 pages.
F. Muñoz et al., *A 4.7mW 89.5dB DR CT Complex ΔΣ ADC with Built-in LPF*, ISSCC 2005 / Session 27 / Filters and Continuous-Time ΣΔConverters / 27.5, 2005 IEEE International Solid-State Circuits Conference, 0-7803-8904-2/05 © 2005, IEEE, 3 pages.
Bupesh Pandita et al., *Oversampling A/D Converters With Reduced Sensitivity to DAC Nonlinearities*, IEEE Transactions on Circuits and Systems—II: Express Briefs, vol. 56, No. 11, Nov. 2009, 5 pages.
Mohammad Ranjbar, *Power Efficient Continuous-Time Delta-Sigma Modulator Architectures for Wideband Analog to Digital Conversion*, Dissertations and Theses, University of Massachusetts—Amherst, ScholarWorks@UMass Amherst, May 1, 2012, 226 pages.
M. Ranjbar, *Continuous-Time Feedforward ΣΔ Modulators with Robust Lowpass STF*, Electronics Letters, Nov. 22, 2007, vol. 43, No. 24, 2 pages.
Mohammad Ranjcar, *A Multibit Dual-Feedback CT ΔΣ Modulator with Lowpass Signal Transfer Function*, IEEE Transactions on Circuits and Systems—I: Regular Papers, vol. 58, No. 9, Sep. 2011, 13 pages.
International Search Report and Written Opinion issued in International Patent Serial No. PCT/US2016/035483 mailed Sep. 19, 2016, 7 pages.

\* cited by examiner

SUPPRESSING SIGNAL TRANSFER FUNCTION PEAKING IN A FEEDFORWARD DELTA SIGMA CONVERTER

PRIORITY DATA

This application is a non-provisional application of and receives benefit of provisional application 62/170,135, entitled "SUPPRESSING SIGNAL TRANSFER FUNCTION PEAKING IN A CONTINUOUS-TIME FEEDFORWARD DELTA SIGMA CONVERTER" and filed on Jun. 3, 2015. The provisional application is hereby incorporated by reference in its entirety.

TECHNICAL FIELD OF THE DISCLOSURE

The present invention relates to the field of integrated circuits, in particular to suppressing signal transfer function peaking in a feedforward delta sigma converter, e.g., continuous-time feedforward delta sigma converter, or discrete-time feedforward delta sigma converter.

BACKGROUND

Data converters are ubiquitous in electronics. Some data converters, e.g., analog-to-digital converters (ADCs) and digital-to-analog converters (DACs), convert signals between the digital domain and the analog domain. Data converters of various flavors are used in a myriad of applications, e.g., high-speed applications, precision applications, mission-critical systems, consumer electronics, entertainment, media systems, telecommunications, medical devices, and so on. Depending on the application, data converters can be designed or selected to suit specifications including: accuracy, resolution, sample rate, bandwidth, power consumption/efficiency, size, amount of noise, anti-aliasing capabilities, etc.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Figure 1:
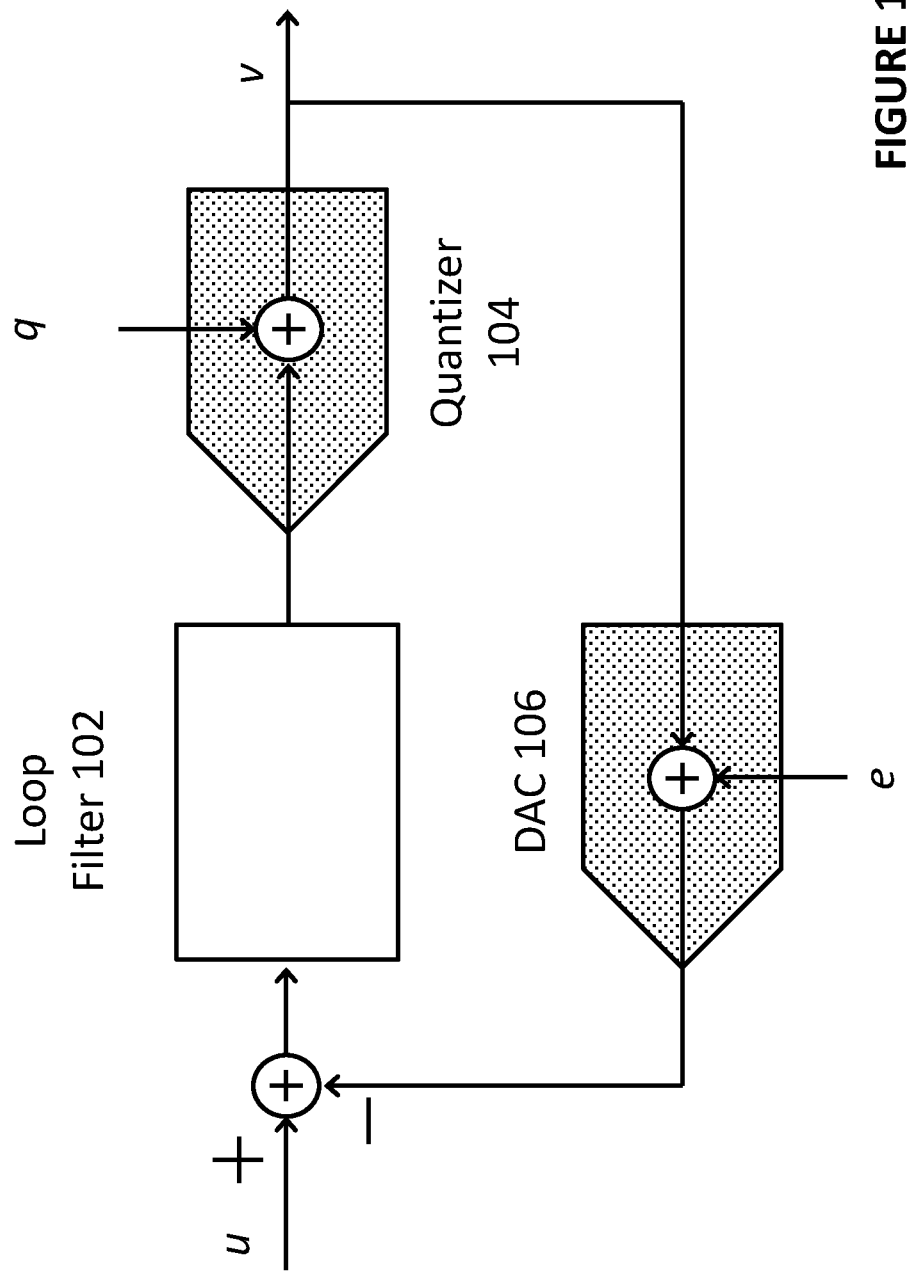
FIG. 1 is an illustrative system diagram of a delta sigma analog-to-digital converter (DS ADC)

A modified topology for a continuous time feedforward delta sigma converter (referred herein as "SCFF") can effectively deal with signal transfer function (STF) peaking, an inherent property of continuous time feedforward delta sigma converters. The SCFF approach involves providing an additional digital-to-analog (DAC) feedback path to the input of the second integrator (incurring an additional DAC in the circuitry, converting the output of the quantizer into an analog signal and feeding the analog signal to the input of the second integrator). Furthermore, the SCFF approach involves providing two feed-ins: a first feed-in to the input of the second integrator and a second feed-in to the input of the third integrator. The first feed-in can be negative. Advantageously, the modified continuous time delta sigma modulator implementing this approach alleviates some of the peaking issues in the signal transfer function while still enjoy low power consumption.

The additional DAC feedback path and one or more additional feed-ins can be used for discrete time feedforward delta sigma modulators. Furthermore, additional DAC feedback path and one or more additional feed-ins can be used for Nth order feedforward delta sigma modulators in general, with any suitable N.

The present disclosure also describes an improved design for continuous time feedforward delta sigma converters. The design involves using an elliptical loop filter instead of Butterworth and inverse Chebyshev filters. The elliptical loop filter gives added rejection for adjacent channels, while enhancing in-band noise performance. The approach providing an additional feedback path to the input of the second integrator and two feed-ins can be combined with elliptical loop filter design for even further improvement in performance, e.g., added rejection for adjacent channels.

Besides providing STF peaking suppression, SCFF provides better alias rejection, compared to other FF structures. SCFF uses one more DAC compared to a pure FF structure. In SCFF, the first integrator has some signal content. SCFF using an elliptical loop filter can have enhanced adjacent channel rejection and better noise performance.

Basics of Analog-to-Digital Converters (ADCs)

Analog to digital converters (ADCs) are electronic devices that convert a continuous physical quantity carried by an analog input or signal to a digital number or output that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal.

An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise "SNR" ratio (how accurately the ADC can measure signal relative to the noise the ADC introduces). Analog-to-digital converters (ADCs) have many different designs, which can be chosen based on the application requirements.

Delta-Sigma Analog-to-Digital Converters (DS ADCs)

Analog-to-digital converters (ADCs) based on delta-sigma (DS) modulation (referred to herein as "DS ADCs") have been widely used in digital audio and high precision instrumentation systems. FIG. 1 is an illustrative system diagram of a delta sigma analog-to-digital converter (DS ADC), or sometimes referred herein as a delta sigma modulator ("DSM"). The DS ADC includes loop filter 102, quantizer 104, and feedback digital-to-analog converter (DAC) 106 (i.e., a DAC in the feedback path of the DS ADC). A DS ADC usually provides the advantage of being able to convert an analog input signal to a digital signal with high resolution at low cost. Typically, a DS ADC encodes an analog signal u using a DS modulator. Quantizer 104 can be used for this purpose, employing, e.g., a low resolution ADC, as a 1-bit ADC, Flash ADC, Flash quantizer, etc. Then, if applicable, the DS ADC can apply a digital filter (not shown) to the output of the DS modulator (i.e., quantizer 104) to form a higher-resolution digital output. Loop filter 102, having one or more integrators, may be included to provide error feedback for the DS ADC and to help shape the noise from the quantizer 104 out of baseband to higher frequencies. The error is usually generated by taking the difference between the original analog input signal u and a reconstructed version of the original analog input signal generated using the feedback DAC 106 (where digitized signal v is converted back into an analog signal). One key characteristic of a DS ADC is its ability to push the quantization noise q (from quantizer 104) to higher frequencies, also referred to as noise shaping. The amount of noise shaping depends on the order of the loop filter 102. As a result, DS ADCs are generally able to achieve high resolution analog-to-digital conversion.

Due to its popularity, many variations on the DS ADC and structures employing the DS ADC have been used and proposed. Depending on the application, different orders of the loop filter can be implemented. In some cases, the DS ADC can be implemented using continuous time circuitry (as opposed to discrete time circuitry). For example, the cascade of integrators can include discrete time integrators. In some cases, DS ADCs can be implemented with a mix of continuous time circuitry and discrete time circuitry for a hybrid architecture. For instance, some of the integrators (e.g., the first integrator in the cascade of integrators) can be implemented using continuous time circuitry while some other integrators (e.g., later integrator(s) in the cascade of integrators) can be implemented using discrete time circuitry. Generally speaking, a continuous time (CT) DS ADC or continuous time circuitry can operate with lower power and achieve better wideband performance than its discrete time counterpart. CT DS ADCs and discrete time DS ADC (hereinafter referred to as DT DS ADCs) can also come in different flavors, e.g., feedback (FB) architecture and feedforward (FF) architecture. Different designs can affect the resulting signal transfer function and/or the noise transfer function of the DS ADC.

The ever increasing data rates in communication moves engineers to design analog-to-digital converters (ADCs) with higher Figures of Merit (FOM), e.g., greater requirements for bandwidth and accuracy, while being power efficient for prolonged battery life of the device having such ADCs. During the last couple of decades continuous time (CT) Delta Sigma (DS) converters have been extensively used in high speed architectures due to the speed versus power advantages over its discrete-time counterpart (DT DS converters, having switch-capacitor circuits), and its inherent anti-aliasing capabilities.

CT DS ADCs: Feedback Versus Feedforward

Figure 2:
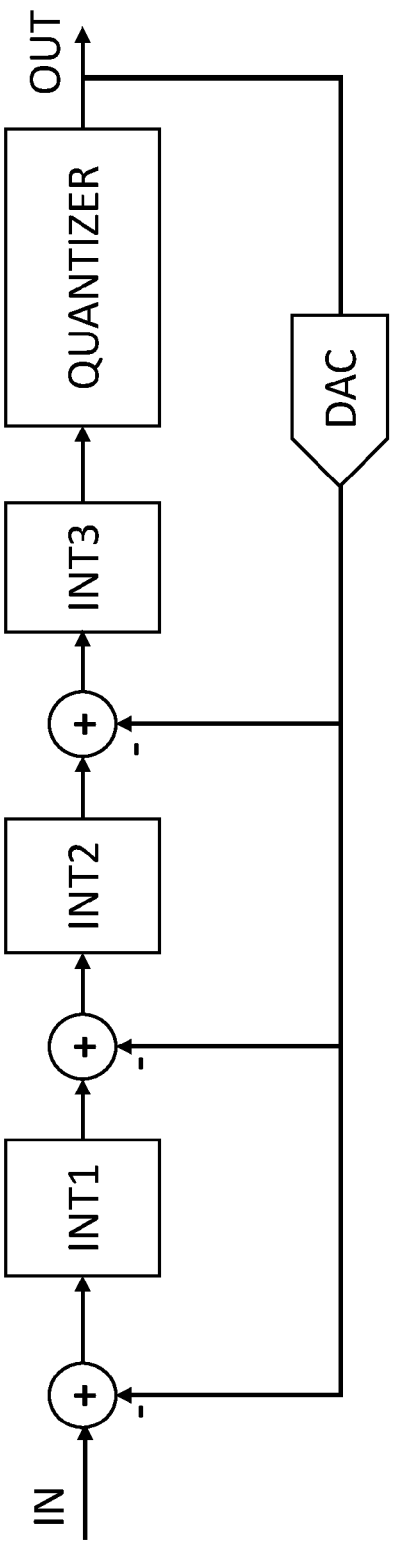
FIG. 2 is an illustrative system diagram of a third-order delta sigma analog-to-digital converter in a feedback configuration.
Figure 3:
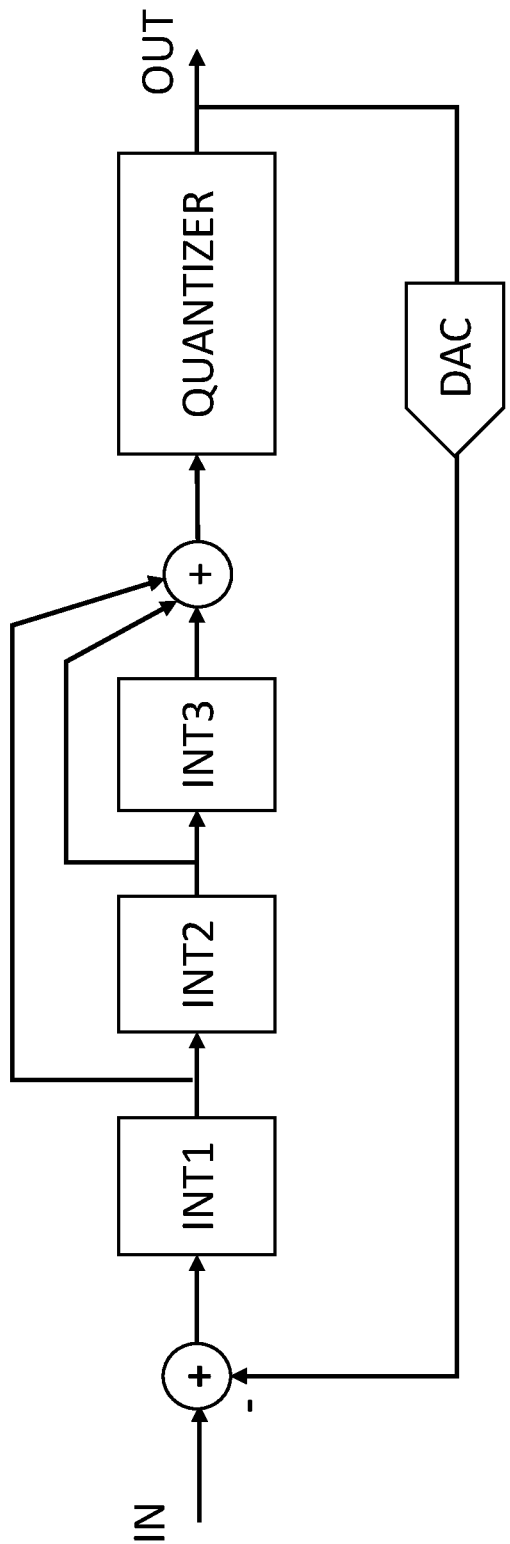
FIG. 3 is an illustrative system diagram of a third-order delta sigma analog-to-digital converter in a feedforward configuration.

To illustrate the difference between a CT FB DS ADC and a CT FF DS ADC, a third-order CT DS ADC having the two configurations are shown in FIGS. 2 and 3 respectively. The illustration can apply to other higher or other lower orders of CT DS ADCs. The CT DS ADC has an analog input ("IN") and a digital output ("OUT"). In both examples of FIGS. 2 and 3, the third-order CT DS ADC has a cascade of three integrators ("INT1", "INT2", and "INT3"), a quantizer ("QUANTIZER") following the cascade of integrators, and one or more feedback DACs (or one or more feedback (DAC) paths). The cascade of the three integrators is formed where the integrator INT2 follows integrator INT1, and the integrator INT3 follows INT2. The quantizer then quantizes the output of the cascade of integrators (i.e., the quantizer processes the output of integrator INT3).

Referring to FIG. 2 showing a third order CT DS ADC in a feedback configuration (referred herein as CT FB DS ADC), the CT DS ADC has feedback paths from the output of the quantizer to the inputs of all integrators. For this example, three feedback DACs can be implemented to provide the three feedback paths from the digital output of the quantizer ("OUT") to the inputs of the integrators INT1, INT2, and INT3. CT FB DS ADCs can be relatively stable, but the distributed feedback paths requiring multiple DACs can make the CT FB DS ADC power hungry. Many communications and radar applications benefit from CT FB DS ADCs.

Referring to FIG. 3 showing a third order CT DS ADC in a feedforward configuration (referred herein as CT FF DS ADC), the CD DS ADC has only a main feedback path from the output of the quantizer to the input of the first integrator INT1, and all the outputs of the integrators INT1, INT2, and INT3 are fed forward to the input of the quantizer (i.e., via three feedforward paths from respective outputs of the integrators to the adder in front of the quantizer). The quantizer would receive a summed signal having all the outputs of the integrators (e.g., summed using an adder in front of the quantizer). Feedforward paths ensures there is little to no signal content at the integrators subsequent to the first integrator, e.g., INT2, and INT3, and thus the subsequent integrators can be implemented and sized with lower power consumption in mind. As a result, CT FF DS ADCs can be much more power efficient than CT FB DS ADCs. Moreover, CT FF DS ADCs converters have relaxed dynamic range requirements when compared to CT FB DS ADCs.

While the above examples are shown as being continuous time delta sigma analog-to-digital converters, DT DS ADCs can also have feedback and feedforward architectures. For a feedback DT DS ADC (DT FB DS ADC), the ADC can have feedback paths from the output of the quantizer to the inputs of all integrators. For a feedforward DT DS ADC (DT FF DS ADC), the ADC can have a single main feedback path from the output of the quantizer to the input of the first integrator INT1, and all the outputs of the integrators INT1, INT2, and INT3 are fed forward to the input of the quantizer. The feedback and feedforward configurations are applicable to hybrid architectures where both continuous time and discrete time circuits are used for the DS ADC.

Signal Transfer Function Peaking Issues Related to Feedforward Designs

Figure 4:
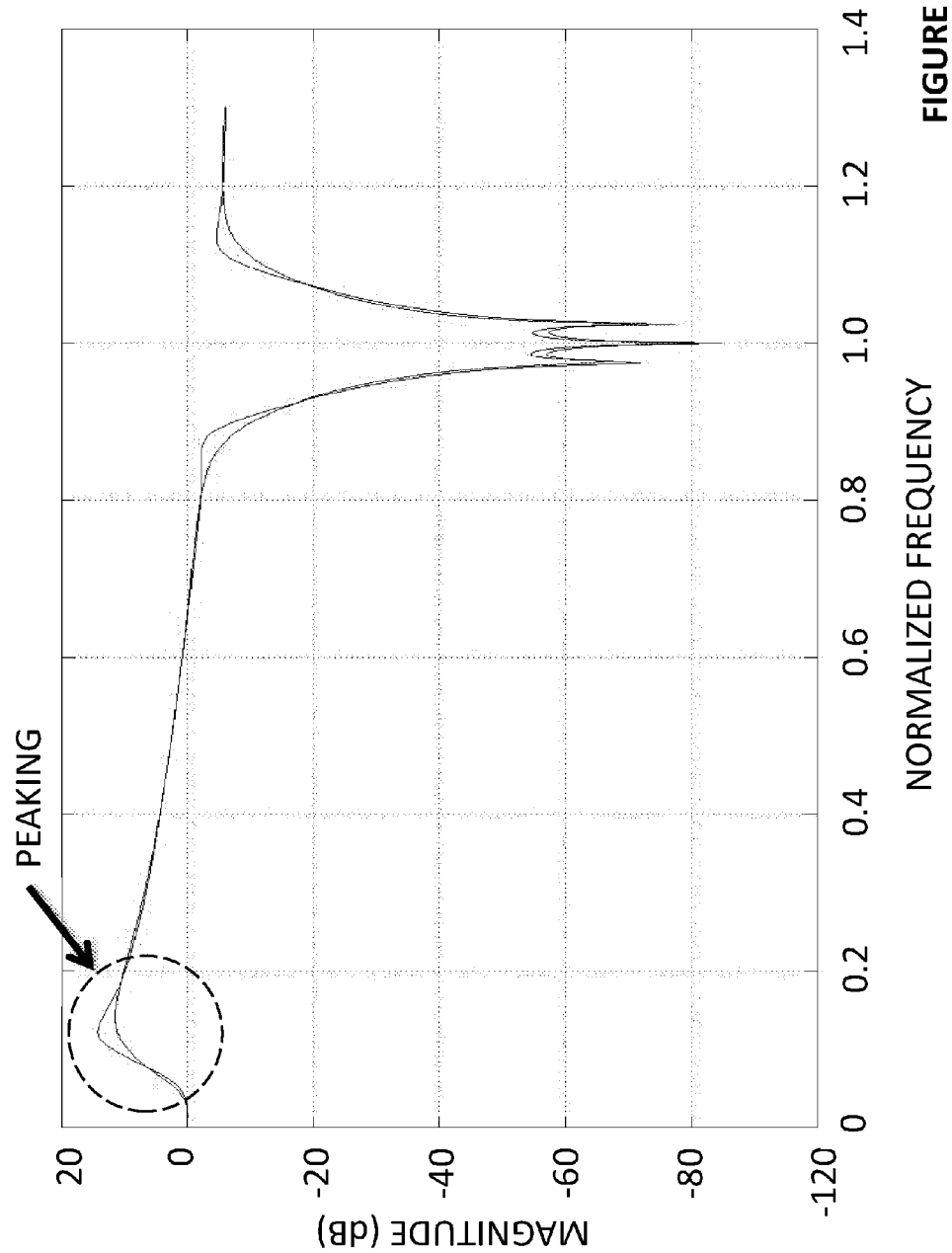
FIG. 4 illustrates signal transfer function peaking of continuous-time delta sigma modulators with a feedforward configuration.

One of the drawbacks of the CT FF ADCs is that the Signal Transfer function (STF) at higher frequencies exhibit peaking. In a CT FF DS converter, at high frequencies, the first integrator and the associated feedforward path overrules other contributors and ensures stability. Referring to FIG. 3, higher frequency signals would traverse the faster path through INT1 and the feedforward path from the output of INT1 to the input of the quantizer. When this occurs, the other integrators (e.g., INT2 and INT3) are no longer contributing, and the DS modulator becomes a first order modulator. As a result, signal transfer function peaking occurs due to the open loop gain making a fast transition from an N-th order behavior to a first order behavior. FIG. 4 illustrates signal transfer function peaking of continuous-time delta sigma modulators with a feedforward configuration. Due to this so called signal transfer function (STF) peaking, CT FF DS ADCs can amplify interferers or out of band blocking signals. This is particularly critical in wireless applications where the presence of out of band blocking signals could cause the modulator to overload. For this reason, designers working in these applications often revert back to using a less power efficient CT FB DS ADC instead of using a CT FF DS ADC. Some designers use a brute force approach to address the interferers and out of band blocking signals by adding a low pass filter or similar in front of the converter to remove the undesirable signal components, but such brute force approach is not always ideal. Using a low pass filter is not a power efficient solution to deal with the undesirable signal components. These aforementioned issues are applicable to DT FF DS ADCs as well, or even hybrid CT-DT FF DS ADCS having both continuous time and discrete time circuitry.

A Modified Continuous Time Feedforward Delta-Sigma Converter ("SCFF")

Addressing the issue of peaking (and cause of peaking), a modified CT FF DS converter (referred herein as "SCFF") involves adding an additional feedback DAC path to the input of the second integrator (incurring an additional DAC in the circuitry) and two feed-ins to the second and third integrators. The second integrator feed-in can be negative or have negative gain. A CT FF DS converter is modified to address the issue of peaking, but the present disclosure envisions that same, equivalent, or similar modifications can also be made to a DT FF DS converter and a hybrid CT-DT FF DS converter having both continuous time and discrete time circuitry.

Figure 5:
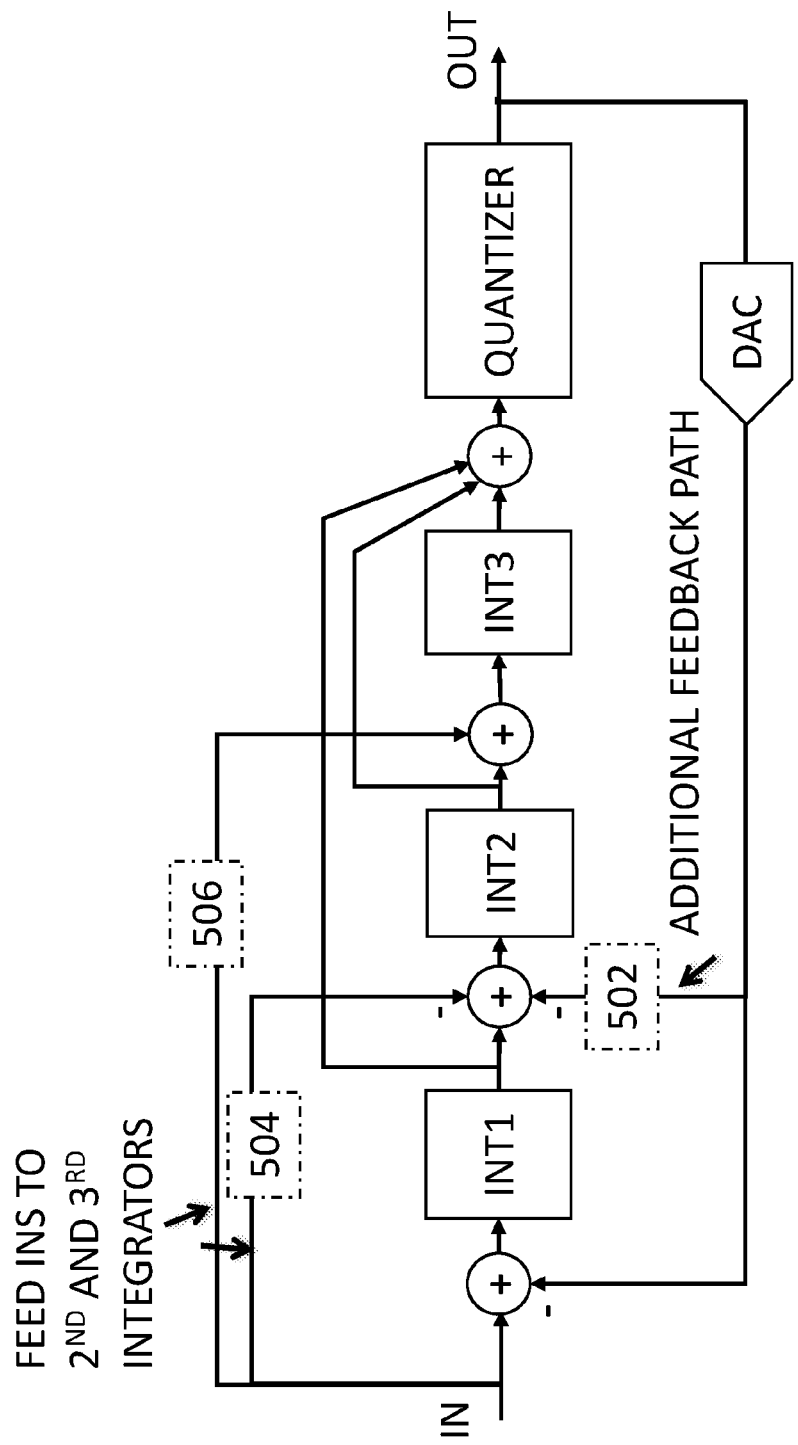
FIG. 5 is an illustrative system diagram of a modified third-order continuous time feedforward delta sigma analog-to-digital converter with STF peaking suppression, according to some embodiments of the disclosure.
Figure 6:
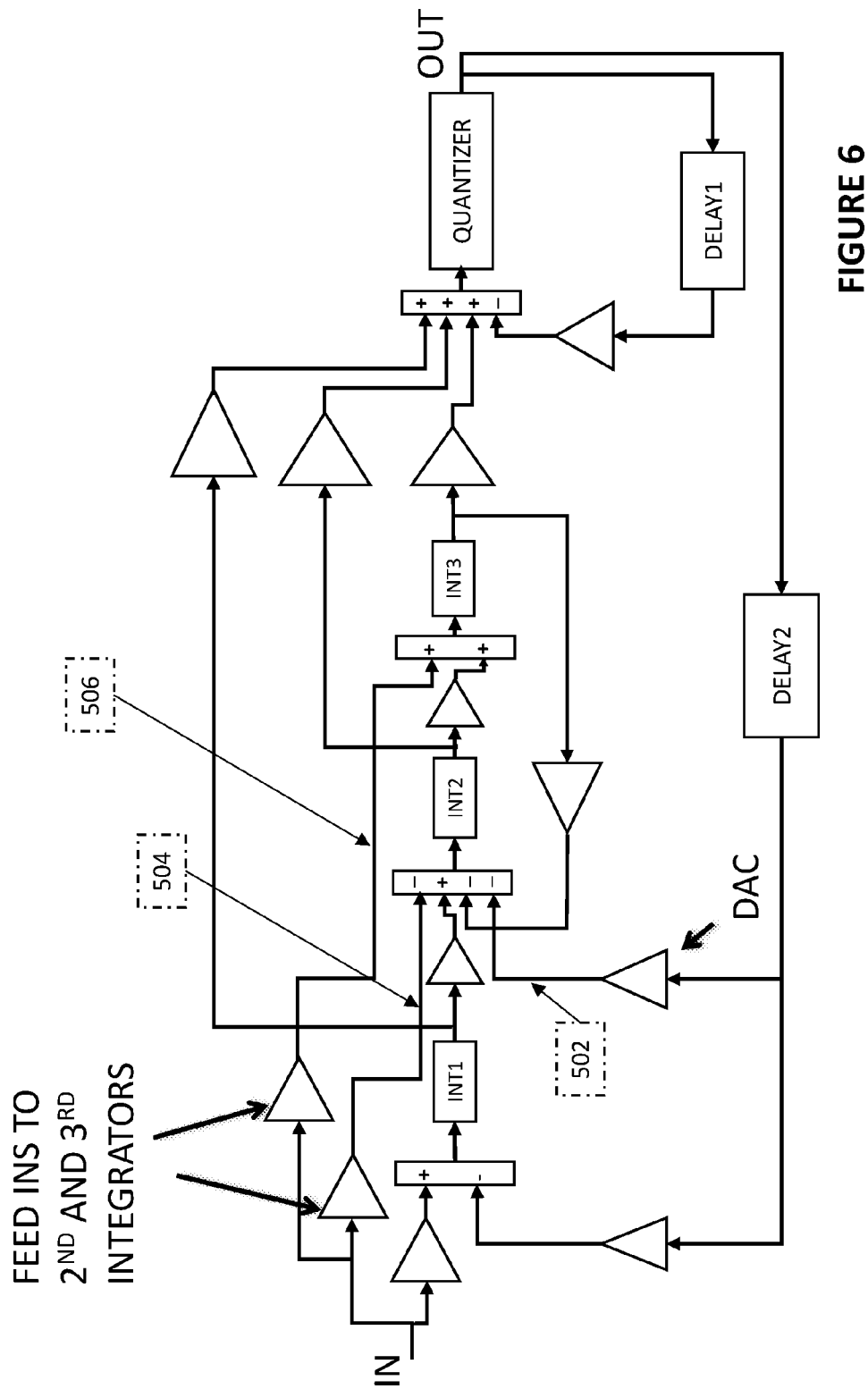
FIG. 6 is an illustrative system diagram of a modified third-order continuous time feedforward delta sigma analog-to-digital converter with STF peaking suppression, according to some embodiments of the disclosure.

FIG. 5 is an illustrative system diagram of a modified third-order continuous time feedforward delta sigma analog-to-digital converter with STF peaking suppression, according to some embodiments of the disclosure, and FIG. 6 is an illustrative system diagram of a modified third-order continuous time feedforward delta sigma analog-to-digital converter with STF peaking suppression, according to some embodiments of the disclosure. The example shown in FIG. 5-6 is a $3^{rd}$ order CT FF DS converter (having three integrators, first integrator INT 1, second integrator INT 2, and third integrator INT 3), but it is envisioned by the disclosure that lower order and higher order CT FF DS ADCs (e.g., Nth order where N can be 1, 2, 3, 4, 5, or higher) can also benefit from the improvement/modification in the architecture. DT FF DS ADCs and hybrid CT-DT FF DS ADCs having both discrete time and continuous time circuitry (e.g., a mix of CT integrator(s) and DT integrator(s)) can also implement and benefit from the improvement/modification in the architecture. SCFF can provide a (desirable) low pass signal transfer function (STF), some adjacent channel suppression, and no compromise of signal-to-noise ratio (SNR), as explained in further detail below.

Referring to FIG. 5, it can be seen that the topology starts with the (conventional) CT FF DS ADC shown in FIG. 4, but three additional paths are added to the topology, and these additional signal paths are not trivial. First, a feedback path 502 is added to the input of the second integrator INT2. Second, a first feed-in path 504 is added from the analog input IN of the whole converter to the input of the second integrator INT2. Third, a second feed-in path 506 is added from the analog input IN of the whole converter to the input of the second integrator INT3. A respective summing nodes can be implemented to sum the signals and provide the summed signal to the respective integrator. These additions to the topology are also shown in FIG. 6. Recall, STF peaking is caused by the fast transition from an Nth order modulator to a first order modulator at higher frequencies. When these additional signal paths are provided to the topology, the second integrator INT2 in the cascade of integrators can be forced to make a contribution to the modulator even at higher frequencies. As a result, the fast transition can be muted or no longer occurs. The modified topology SCFF results in a design that leverages the low power consumption benefits of a CT FF DS ADC and the lack of STF peaking of a CT FB DS ADC. When not all of the integrators have a feedback path (i.e., incurring an additional feedback DAC), the power savings for a higher order loop DS ADC can be substantial, while the DS ADC having the SCFF topology can still enjoy the suppression of STF peaking.

In some embodiments, a modified (continuous time) feedforward delta sigma analog-to-digital converter with signal transfer function peaking suppression ("SCFF") comprises a cascade of integrators receiving an analog input "IN" of the converter (e.g., first one of the integrators INT1, second one of the integrators INT2, and third one of the integrators INT3). The cascade of integrators form a loop filter (e.g., such as the loop filter 102 illustrated in the basic DS ADC of FIG. 1). The SCFF converter further includes a quantizer for quantizing a sum of the outputs of the integrators (having the feedforward paths characteristic of a CT FF DS ADC). Phrased differently, an adder can sum all the outputs of the integrators (e.g., INT1, INT2, and INT3), and provide the sum to a coarse analog-to-digital converter as the quantizer). The quantizer is further configured to generate a digital output of the converter "OUT" (e.g., by digitizing the sum of the outputs of the integrators). To provide a main feedback path, the quantizer is further configured to provide feedback to input of a first one of the integrators (e.g., INT1). Phrased differently, a feedback path can be provided from the output of the quantizer to the input of INT1. A feedback digital-to-analog converter can be implemented for generating a feedback signal for a feedback path based on the digital output from the quantizer. In some examples, the SCFF converter includes a main feedback path from the output of the quantizer to the input of the first integrator. To provide the additional signal paths to suppress STF peaking, the SCFF converter further includes: a feedback path (e.g., 502 of FIGS. 5 and 6) from the digital output of the quantizer to an input of a second one of the integrators (e.g., INT2) (which can be implemented using an additional feedback DAC), and one or more feed-in paths from the analog input of the converter (e.g., IN) to inputs of one or more ones of the integrators subsequent to the first one of the integrators.

In some embodiments, the one or more feed-in paths comprises a first feed-in path (e.g., 504 of FIGS. 5 and 6) from the analog input of the converter to the input of the second one of the integrators (e.g., INT2). The first feed-in path can be provided to a summer generating the input to the second one of the integrators. In some embodiments, the one or more feed-in paths comprises a second feed-in path (e.g., 506 of FIGS. 5 and 6) from the analog input of the converter to the input of a third one of the integrators (e.g., INT3). The second feed-in path can be provided to a summer generating the input to the third one of the integrators. Broadly speaking, the feed-in paths can be provided to a summer for summing the signal from the feed-in path (i.e., the analog input IN) and an output of the previous integrator.

Feed-in paths can be implemented using resistors and/or capacitors. In some embodiments, the first feed-in path has negative gain. A negative gain can be applied to the analog input signal to the SCFF converter (IN) prior to adding the feed-in to the input of the second one of the integrators (e.g., INT2). In some embodiments, the second feed-in path has positive gain. In some embodiments, the one or more one or more feed-in paths to inputs of one or more ones of the integrators subsequent to the first one of the integrators (e.g., 504 and 506 of FIGS. 5 and 6) are implemented with resistors and/or capacitors. Feedback paths can include or be implemented with one or more of the following: switched current circuits (e.g., current mode circuits), switched capacitor circuits, and switched resistor circuits.

In some embodiments, the feed-ins are provided to only the first one of the integrators (INT1) (by default), the second one of the integrators (INT2), and a third one of the integrators (INT3). Other integrators (if any) do not have feed-ins. Phrased differently, inputs of one or more ones of the integrators subsequent to a third one of the integrators do not receive the analog input of the converter.

In some embodiments, the SCFF topology is not a full CT FB DS ADC, where feedback paths are provided to all the integrators. For instance, one or more integrators subsequent to the first one and second one of the integrators (e.g., INT3 or subsequent integrators in the cascade of integrators) do not receive feedback from the output of the quantizer.

It is appreciated by one skilled in the art that one or more additional feed-in path(s) and the feedback path to the input of the second integrator (or to the input of the quantizer if the DS ADC is a first order DS ADC) can be implemented for feedforward delta sigma analog-to-digital converter of any suitable order. Furthermore, the additional feed-in path(s) and the additional feedback path as described herein can be added to FF DS ADCs having continuous time integrator(s), discrete time integrator(s), or both continuous time integrators and discrete time integrators.

Figure 7:
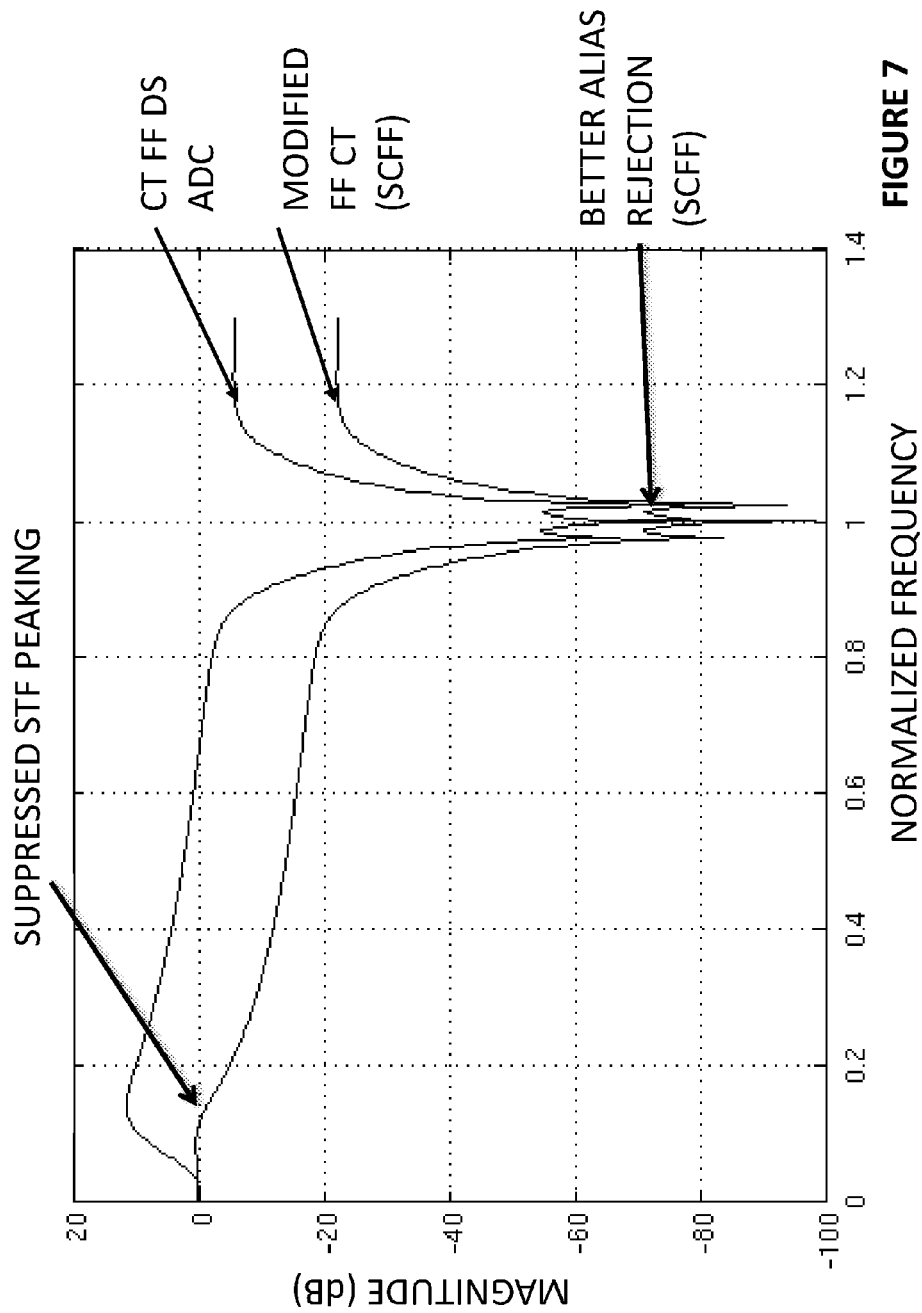
FIG. 7 shows the signal transfer function for a continuous time feedforward delta sigma analog-to-digital converter and the signal transfer function of a modified continuous time feedforward delta sigma analog-to-digital converter, according to some embodiments of the disclosure.
Figure 8:
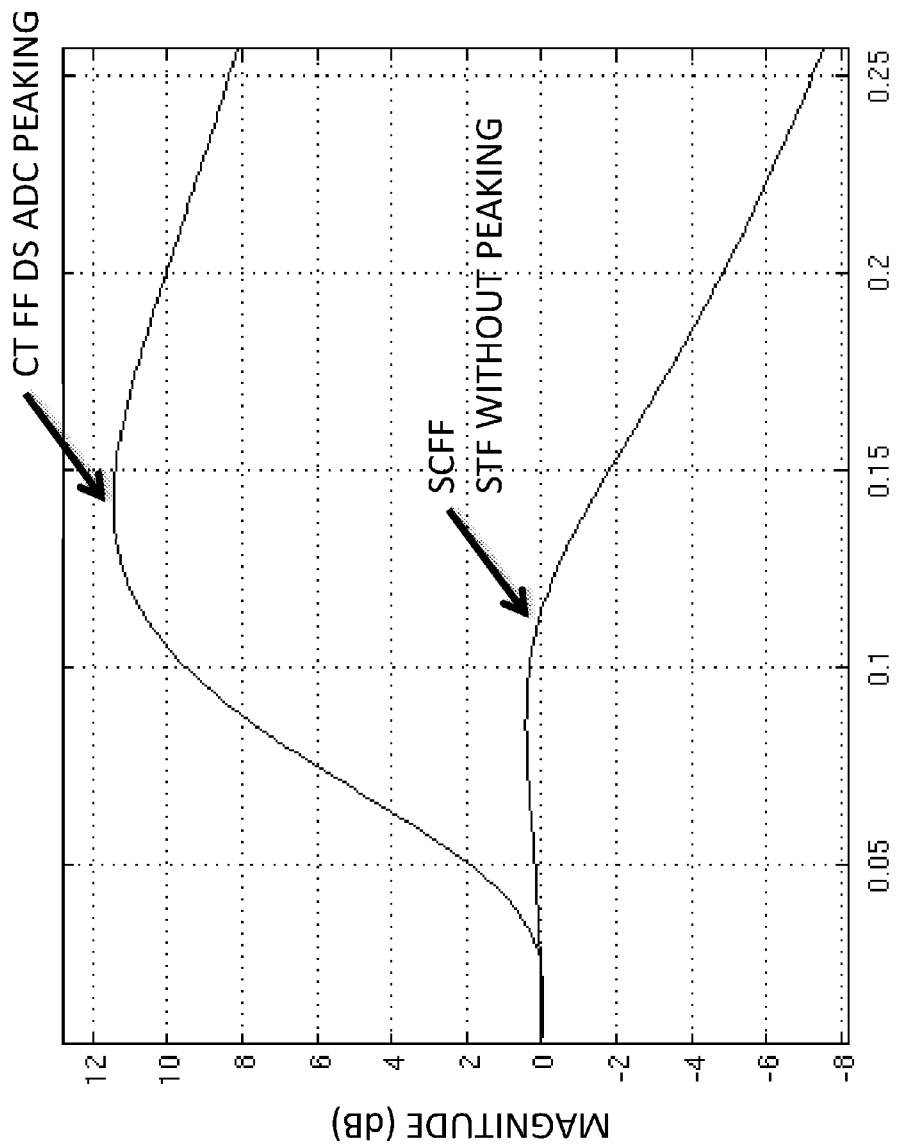
FIG. 8 illustrates suppression of signal transfer function peaking by of a modified continuous time feedforward delta sigma analog-to-digital converter, according to some embodiments of the disclosure.
Figure 9:
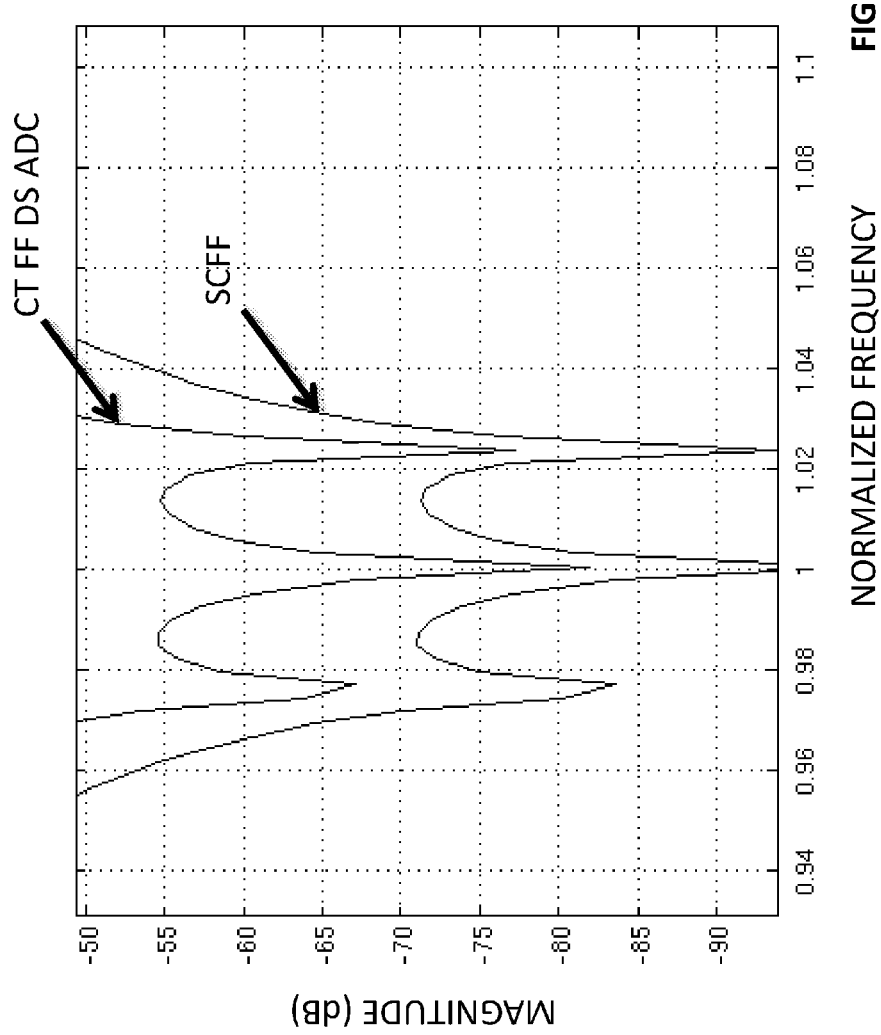
FIG. 9 illustrates better alias rejection by of a modified continuous time feedforward delta sigma analog-to-digital converter, according to some embodiments of the disclosure.

The STF for the SCFF and the STF for a conventional CT FF DS ADC are shown in FIG. 7. For SCFF, it can be seen from the STF plot that that low pass STF is achieved, and STF peaking is suppressed. This means that a low power architecture can be used without incurring the penalty of STF peaking associated with pure FF DS ADCs. This SCFF structure also has better alias rejection compared for a conventional CT FF DS ADC structure. FIG. 8 shows the suppression of STF peaking for SCFF when compared with the conventional CT FF structure. FIG. 9 shows that SCFF can have (much) better alias rejection when compared with the conventional CT FF DS ADC structure. Typically, to achieve better alias rejection, the DS ADC has to consume more power. With the improvement in alias rejection due to SCFF, the SCFF can achieve the same performance in alias rejection without having incur more power consumption.

Elliptical Loop Filter

Figure 10:
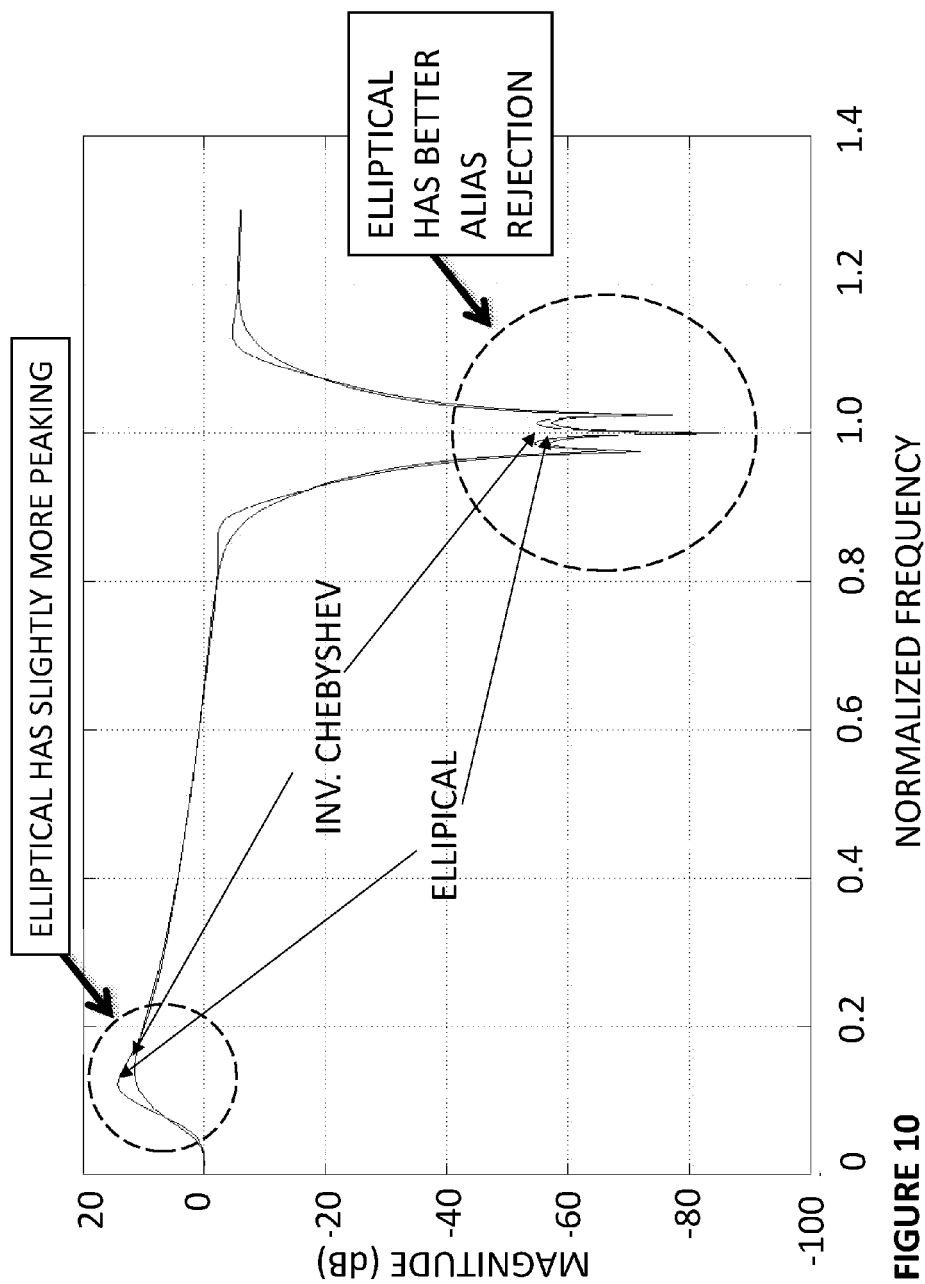
FIG. 10 shows the signal transfer function of a continuous time feedforward delta sigma analog-to-digital converter having an inverse Chebyshev loop filter and the signal transfer function of a continuous time feedforward delta sigma analog-to-digital converter having an elliptical loop filter.

CT FF DS converters have often used Butterworth and inverse Chebyshev loop filters. Instead of using Butterworth and inverse Chebyshev loop filters, a CT FF DS converter can use an elliptical loop filter design to improve performance. A DT FF DS ADC or a FF DS ADC having both continuous time and discrete time integrators can also use an elliptical loop filter design to improve performance. FIG. 10 shows the STF of a CT FF DS ADC having an inverse Chebyshev loop filter and the STF of a CT FF DS ADC having an elliptical loop filter. The STF of a CT FS DS converter with an elliptical loop filter has slightly more peaking but achieves better alias rejection when compared against the inverse Chebyshev loop filter. The elliptical loop filter can provide better overall performance when compared against Butterworth and inverse Chebyshev filters (e.g., achieving 3 dB improvement, without having to double the power). Viewed differently, using an elliptical loop filter design can achieve the same performance while using less power, since normally doubling of power is needed to achieve a 3 dB improvement in overall performance. Furthermore, coefficient sensitivity of the elliptical loop filter can be mitigated by R and C tuning (tuning of resistor and capacitor values).

In some embodiments, a continuous time feedforward delta sigma analog-to-digital converter can include a cascade of integrators receiving an analog input of the converter and a quantizer for quantizing a sum of the outputs of the integrators, generating a digital output of the converter, and providing feedback to input of a first one of the integrators (e.g., INT1). Such a structure is illustrated by FIGS. 3, 5, and 6. The cascade of integrators (e.g., INT1, INT2, and INT3 of FIGS. 3, 5, and 6) can an elliptical loop filter to achieve better alias rejection.

Similarly, a discrete time feedforward delta sigma analog-to-digital converter or a (hybrid CT-DT) feedforward delta sigma having both continuous time integrator(s) and discrete time integrator(s) can include a cascade of integrators receiving an analog input of the converter and a quantizer for quantizing a sum of the outputs of the integrators, generating a digital output of the converter, and providing feedback to input of a first one of the integrators (e.g., INT1). The cascade of integrators (e.g., INT1, INT2, and INT3 of FIGS. 3, 5, and 6) can an elliptical loop filter to achieve better alias rejection. While the elliptical loop filter can be used for DT FF DS ADCs or hybrid CT-DT FF DS ADCs, using continuous time integrators for the DS ADC can achieve further power savings over the discrete time or hybrid CT-DT counterparts.

In some embodiments, the elliptical loop filter can be implemented with the modified topology SCFF DS ADC (or other DT FF DS ADCs or hybrid CT-DT FF DS ADCs having the modifications described herein). Interestingly, the combination of the SCFF topology and an elliptical filter design results in unexpected benefits of further suppression of adjacent channels. To provide the SCFF topology, such a converter can further include a main feedback path from the output of the quantizer to the input of a first one of the integrators, and a further feedback path (e.g., 502 of FIGS. 5 and 6) from the digital output of the quantizer to an input of a second one of the integrators (e.g., INT2 of FIGS. 5 and 6). The converter can further include one or more feed-in paths (e.g., 504 and 506 of FIGS. 5 and 6) from the analog input of the converter to inputs of one or more ones of the integrators subsequent to the first one of the integrators. The one or more feed-in paths can include one or more of the following: a first feed-in path (e.g., 504 of FIGS. 5 and 6) from the analog input of the converter to the input of the second one of the integrators (e.g., INT2 of FIGS. 5 and 6), and a second feed-in path (e.g., 504 of FIGS. 5 and 6) from the analog input of the converter to the input of a third one of the integrators (e.g., INT3 of FIGS. 5 and 6). In some embodiments, the first feed-in path has negative gain. To achieve the surprising benefits, the cascade of integrators is a part of a loop filter, and the loop filter is an elliptical loop filter.

Figure 11:
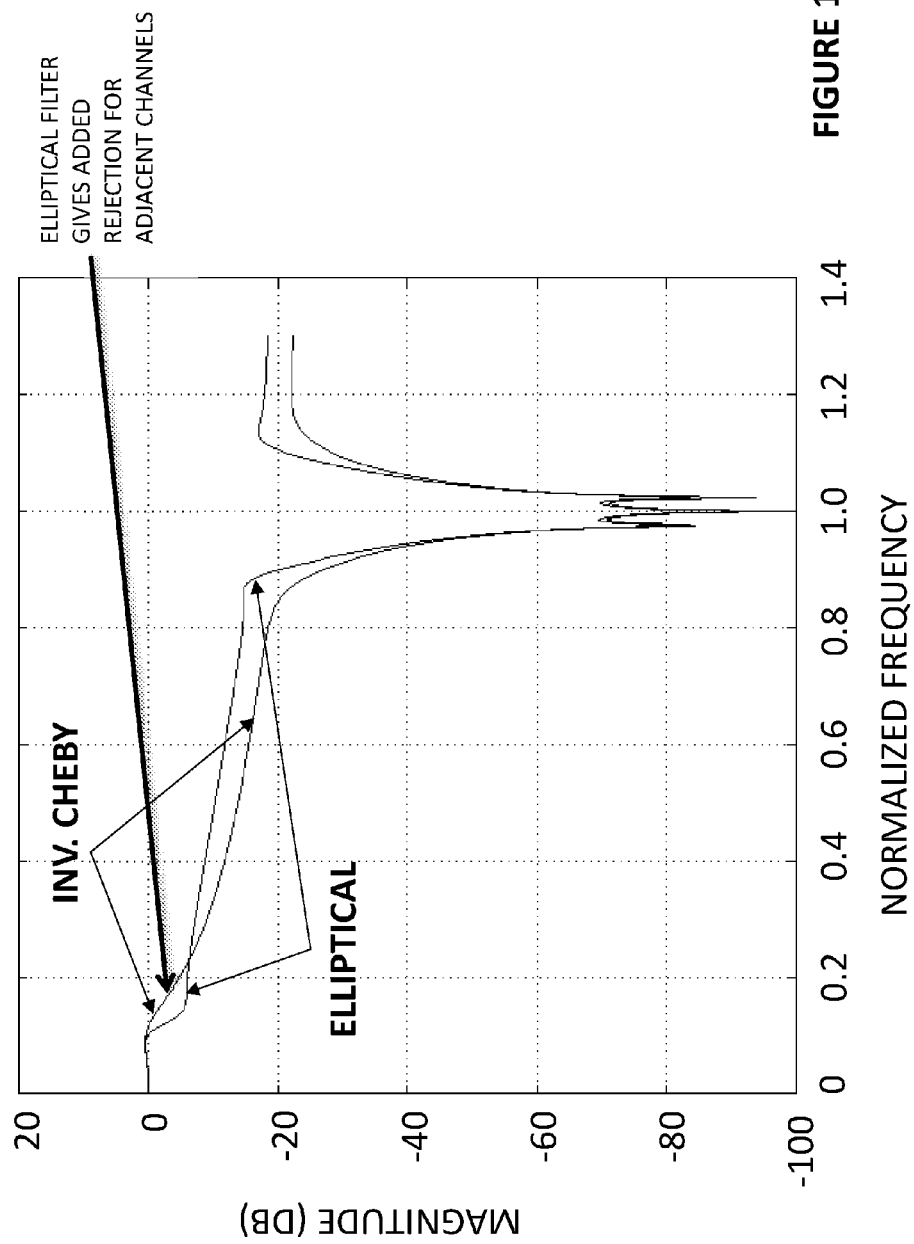
FIG. 11 shows signal transfer function of a modified continuous time feedforward delta sigma analog-to-digital converter having an inverse Chebyshev loop filter and the signal transfer function of a modified continuous time feedforward delta sigma analog-to-digital converter having an elliptical loop filter with added rejection for adjacent channels, according to some embodiments of the disclosure.

FIG. 11 shows the STF of SCFF CT DS ADC having an inverse Chebyshev loop filter and the STF of SCFF CT DS ADC having an elliptical loop filter. It can be seen that STF peaking of SCFF with an elliptical loop filter remains suppressed, and alias rejection performance is still good. It can also be seen that the elliptical loop filter gives an unexpected effect of added suppression/rejection for adjacent channels (as indicated by the dip in the STF curve), when the elliptical loop filter is used with the SCFF CT DS ADC. The same benefit can be achieved for DT FF DS ADCs or hybrid CT-DT FF DS ADCs (having both continuous time and discrete time integrators.

Method for Delta Sigma Modulation

Figure 12:
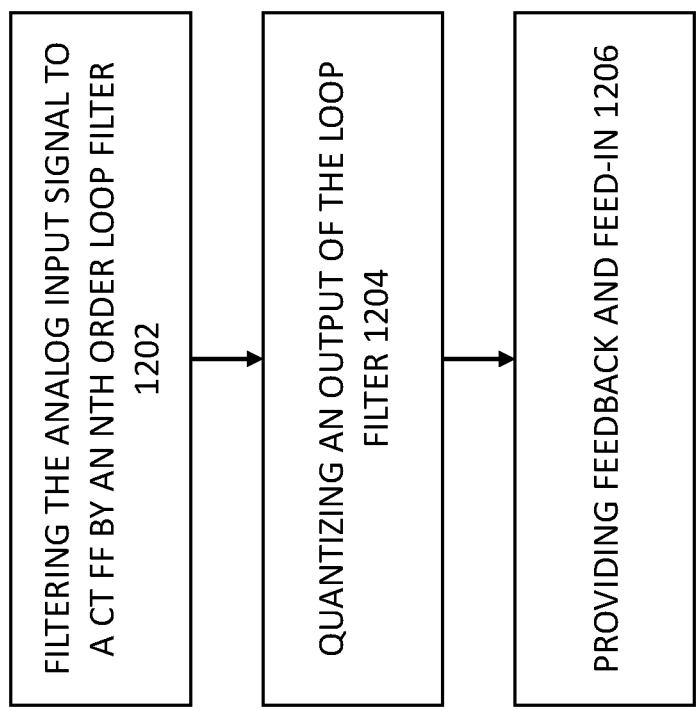
FIG. 12 is a flow diagram illustrating a method for delta sigma modulation, according to some embodiments of the disclosure.

FIG. 12 is a flow diagram illustrating a method for delta sigma modulation, according to some embodiments of the disclosure. The method for delta sigma modulation with signal transfer function peaking suppression comprises several tasks. In task 1202, the analog input signal (e.g., IN) to a feedforward delta sigma analog-to-digital converter is filtered by an Nth order loop filter having a cascade of N integrators. The feedforward delta sigma analog-to-digital converter can have continuous time integrators, discrete time integrators, or both. Having continuous time integrators can achieve more power savings over discrete time integrators. In task 1204, a quantizer digitizes or quantizes an output of the loop filter. In task 1206, a feedback signal is provided from the output of the quantizer to a first one and a second one of the integrators. Furthermore, in task 1206, the analog input signal is provided as "feed-ins" to inputs of one or more ones of the N integrators subsequent to the first one of the integrators. Advantageously, task 1206 prevents the loop filter from switching from operating as an Nth order loop filter to operating a first order loop filter when filtering the analog input at higher frequencies, which ultimately results in STF peaking suppression.

In some embodiments, providing the analog input signal comprises providing the analog input of the converter to the input of the second one of the integrators and the input of a third one of the integrators (e.g., 504 and 506 of FIGS. 5-6). In some embodiments, the Nth order loop filter is an elliptical loop filter to achieve even better adjacent channel rejection. In some embodiments, N is equal to or greater than 3 (but other higher or lower values of N are envisioned by the disclosure).

Variations and Implementations

Note that the activities discussed above with reference to the FIGURES are applicable to any integrated circuits that involve providing an analog-to-digital converter for converting an analog signal to a digital signal (usually integrated circuits which may otherwise use a CT FF DS ADC, a CT FB DS ADC, DT FF DS ADC, DF FB DS ADC, hybrid CT-DT FF DS ADCs, hybrid CT-DT FB DS ADCs, or any flavor of DS ADCs). As discussed previously, the modifications to the FF DS ADC (i.e., the one or more additional feed-ins, and the additional feedback path) can be applied to FF DS ADCs of any order. Furthermore, the modifications are applicable to CT FF DS ADCs, DT FF DS ADCs, hybrid CT-DT FF DS ADCs, low pass delta sigma converters, bandpass delta sigma converters. A single-ended implementation or a differential implementation can be used for implementing the circuits of the modified FF DS ADC described herein.

One exemplary application is a wideband analog front end for Radar for Advanced Driver Assistance systems (ADAS), where the modified FF DS ADC can be used to digitize received signals for the Radar system. Other exemplary applications of the modified CT FF DS converter (SCFF) and variations thereof include: automotive, building technology, communications (wired and/or wireless), consumer electronics, digital imaging, radar, home entertainment, portable electronics, energy, healthcare, industrial automation/control, wearables, internet of things, etc. Generally speaking, SCFF converter is useful for low power applications where adjacent channel rejection in the presence of interferers is desirable. The SCFF topology allows for more power efficient CT FF DS ADC to be used while at the same time be immune to blockers and other interferers. These interferers would normally impact a normal implementation by either cutting into the dynamic range or driving the ADC into saturation. The SCFF converter addresses this problem without incurring the power penalty.

In applications like communications and radar, there are lots of interferers right outside of "the field of view", if those interferers are aliased into the pass band, or is amplified due to STF peaking, this can overload the ADC. Using the modified CT FF DS topology, these issues can be addressed without having to provide an additional filter at the input of the converter or having to revert to a more power hungry CT FB DS ADC design.

For instance, automotive Radar for 77 GHZ and 24 GHz systems can make use of the SCFF converter or variations described herein. In this application, power consumption is very important and needs to be as low as possible, and so is blocker rejection as reflections are a big issue. In another instance, communication infrastructure can benefit from the SCFF converter. Other applications include medical vital signs monitoring ($SpO_2$ monitoring, heart rate monitoring, etc.). Generally speaking, the SCFF converter can be used as an ultra low power converter, where blockers can be an issue.

In one example embodiment, any number of electrical circuits of the FIGURES (e.g., FIG. 5-6) may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the modified CT FF DS converter (SCFF), e.g., illustrated by FIG. 12 illustrate only some of the possible functions that can be implemented by the circuitry illustrated in the FIG. 5-6. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that all such changes, substitutions, variations, alterations, and modifications as falling within the scope of the present disclosure. Note that all optional features of the apparatus described above may also be implemented with respect to the method or process described herein and specifics in the examples may be used anywhere in one or more embodiments.

EXAMPLES

Example 101 is a modified feedforward delta sigma analog-to-digital converter with signal transfer function peaking suppression, comprising a cascade of integrators receiving an analog input of the converter, a quantizer for quantizing a sum of the outputs of the integrators and generating a digital output of the converter, and providing feedback to input of a first one of the integrators, a feedback path from the digital output of the quantizer to an input of a second one of the integrators, and one or more feed-in paths from the analog input of the converter to inputs of one or more ones of the integrators subsequent to the first one of the integrators.

In Example 102, any one of the examples herein can further include the cascade of integrators comprising one or more continuous time integrators. In some examples, the cascade of integrators include one or more discrete time integrators.

In Example 103, any one of the examples herein can further the one or more feed-in paths comprising a first feed-in path from the analog input of the converter to the input of the second one of the integrators.

In Example 104, any one of the examples herein can further include the one or more feed-in paths comprising a second feed-in path from the analog input of the converter to the input of a third one of the integrators.

In Example 105, any one of the examples herein can further include the first feed-in path having negative gain.

In Example 106, any one of the examples herein can further include the second feed-in path having positive gain.

In Example 107, any one of the examples herein can further include the one or more one or more feed-in paths to inputs of one or more ones of the integrators subsequent to the first one of the integrators being implemented with resistors and/or capacitors.

In Example 108, any one of the examples herein can further include the feedback path from the digital output of the quantizer to the input of the second one of the integrators comprising one or more of the following: switched current circuits, switched capacitor circuits, and switched resistor circuits In Example 109, any one of the examples herein can further include inputs of one or more ones of the integrators subsequent to a second one of the integrators not receiving the analog input of the converter.

In Example 110, any one of the examples herein can further include a main feedback path from the output of the quantizer to the input of the first integrator.

In Example 111, any one of the examples herein can further include one or more integrators subsequent to the first one and second one of the integrators not receiving feedback from the output of the quantizer.

In Example 112, any one of the examples herein can further include the cascade of integrators being a part of a loop filter, and the loop filter is an elliptical loop filter.

Example 201 is a continuous time feedforward delta sigma analog-to-digital converter comprising: a cascade of integrators receiving an analog input of the converter, and a quantizer for quantizing a sum of the outputs of the integrators and generating a digital output of the converter, and providing feedback to input of a first one of the integrators, wherein the cascade of integrators form an elliptical loop filter.

In Example 202, any one of the examples herein can further include a main feedback path from the output of the quantizer to the input of a first one of the integrators, and a further feedback path from the digital output of the quantizer to an input of a second one of the integrators.

In Example 203, any one of the examples herein can further include one or more feed-in paths from the analog input of the converter to inputs of one or more ones of the integrators subsequent to the first one of the integrators.

In Example 204, any one of the examples herein can further include the one or more feed-in paths comprising: a first feed-in path from the analog input of the converter to the input of the second one of the integrators, and a second feed-in path from the analog input of the converter to the input of a third one of the integrators.

In Examples 205, any one of the examples herein can further include the first feed-in path having negative gain.

Example 301 is a method for delta sigma modulation with signal transfer function peaking suppression, comprising: filtering the analog input signal to a feedforward delta sigma analog-to-digital converter by an Nth order loop filter having a cascade of N integrators, quantizing an output of the loop filter, providing a feedback signal from the output of the quantizer to a first one and a second one of the integrators, and providing the analog input signal to inputs of one or more ones of the N integrators subsequent to the first one of the integrators.

In Example 302, any one of the examples herein can further include providing the feedback signal and the analog input signal to the second one of the N integrators preventing the loop filter from switching from operating as an Nth order loop filter to operating a first order loop filter when filtering the analog input at higher frequencies.

In Example 303, any one of the examples herein can further include providing the analog input signal comprising providing the analog input of the converter to the input of the second one of the integrators and the input of a third one of the integrators.

In Example 304, any one of the examples herein can further include the Nth order loop filter being an elliptical loop filter.

In Example 305, any one of the examples herein can further include suppressing by the elliptical loop filter, adjacent channels for the feedforward delta sigma analog-to-digital converter.

In Example 306, any one of the examples herein can include N being 1 or greater.

In Example 307, any one of the examples herein can include N being 2 or greater.

In Example 308, any one of the examples herein can include N being 3 or greater.

In Example 309, any one of the examples herein can include the feedforward delta sigma analog-to-digital converter being a low pass delta sigma converter.

In Example 310, any one of the examples herein can include the feedforward delta sigma analog-to-digital converter being a band pass delta sigma converter.

In Example 311, any one of the examples herein can include the feedforward delta sigma analog-to-digital converter being a single-ended delta sigma converter.

In Example 312, any one of the examples herein can include the feedforward delta sigma analog-to-digital converter being a differential delta sigma converter.

What is claimed is:

1. A modified feedforward delta sigma analog-to-digital converter, comprising:
    a cascade of integrators receiving an analog input of the converter;
    a quantizer for quantizing a sum of the outputs of the integrators and generating a digital output of the converter, and providing feedback to input of a first one of the integrators;
    a feedback path from the digital output of the quantizer to an input of a second one of the integrators; and
    one or more feed-in paths from the analog input of the converter to inputs of one or more ones of the integrators subsequent to the first one of the integrators, the one or more feed-in paths comprising a first feed-in path from the analog input of the converter to the input of the second one of the integrators and a second feed-in path from the analog input of the converter to the input of a third one of the integrators.

2. The converter of claim 1, wherein the cascade of integrators comprises one or more continuous time integrators.

3. The converter of claim 1, wherein the first feed-in path has negative gain.

4. The converter of claim 1, wherein the second feed-in path has positive gain.

5. The converter of claim 1, wherein the one or more feed-in paths to inputs of one or more ones of the integrators subsequent to the first one of the integrators are implemented with resistors and/or capacitors.

6. The converter of claim 1, wherein the feedback path from the digital output of the quantizer to the input of the second one of the integrators comprises one or more of the following: switched current circuits, switched capacitor circuits, and switched resistor circuits.

7. The converter of claim 1, wherein inputs of one or more ones of the integrators subsequent to a second one of the integrators do not receive the analog input of the converter.

8. The converter of claim 1, further comprising:
a main feedback path from the output of the quantizer to the input of the first integrator.

9. The converter of claim 1, wherein one or more integrators subsequent to the first one and second one of the integrators do not receive feedback from the output of the quantizer.

10. The converter of claim 1, wherein the cascade of integrators is a part of a loop filter, and the loop filter is an elliptical loop filter.

11. A continuous time feedforward delta sigma analog-to-digital converter comprising:
a cascade of integrators receiving an analog input of the converter; and
a quantizer for quantizing a sum of the outputs of the integrators and generating a digital output of the converter, and providing feedback to input of a first one of the integrators;
wherein the cascade of integrators form an elliptical loop filter.

12. The converter of claim 11, further comprising:
a main feedback path from the output of the quantizer to the input of a first one of the integrators; and
a further feedback path from the digital output of the quantizer to an input of a second one of the integrators.

13. The converter of claim 11, further comprising:
one or more feed-in paths from the analog input of the converter to inputs of one or more ones of the integrators subsequent to the first one of the integrators.

14. A method for delta sigma modulation, comprising:
filtering an analog input signal by a loop filter, wherein filtering the analog input signal comprises receiving a feedback signal at inputs of a first integrator and a second integrator of the loop filter, and receiving the analog input signal at inputs of the second integrator and a third integrator of the loop filter;
quantizing, a summed signal having all outputs of integrators of the loop filter.

15. The method of claim 14, wherein providing the feedback signal and the analog input signal to the second one of the N integrators prevents the loop filter from switching from operating as an Nth order loop filter to operating a first order loop filter when filtering the analog input at higher frequencies.

16. A method for delta sigma modulation, comprising:
filtering an analog input signal by an elliptical loop filter, wherein filtering the analog input signal comprises receiving a feedback signal at inputs of a first integrator and a second integrator of the elliptical loop filter, and receiving the analog input signal at one or more inputs of one or more integrators of the elliptical loop filter;
quantizing a summed signal having all outputs of integrators of the elliptical loop filter.

17. The method of claim 16, further comprising:
suppressing, by the elliptical loop filter, adjacent channels for the feedforward delta sigma analog-to-digital converter.

18. The converter of claim 10, wherein one or more feed-in paths comprises a negative gain feed-in path from the analog input of the converter to the input of a second one of the integrators.

19. The converter of claim 10, wherein the one or more feed-in paths to inputs of one or more ones of the integrators subsequent to the first one of the integrators are implemented with resistors and/or capacitors.

20. The converter of claim 10, wherein the feedback path from the digital output of the quantizer to the input of the second one of the integrators comprises one or more of the following: switched current circuits, switched capacitor circuits, and switched resistor circuits.

* * * * *

UNITED STATES PATENT AND TRADEMARK OFFICE
CERTIFICATE OF CORRECTION

PATENT NO. : 9,564,916 B2
APPLICATION NO. : 15/067847
DATED : February 7, 2017
INVENTOR(S) : Abhishek Bandyopadhyay It is certified that error appears in the above-identified patent and that said Letters Patent is hereby corrected as shown below:

On the Title Page

Item (63), under the "Related U.S. Application Data" section, delete "Continuation of application No. 62/170,135, filed on Jun. 3, 2015" and insert -- "Provisional application No. 62/170,135, filed on Jun. 3, 2015" --.

Signed and Sealed this
Fourth Day of August, 2020

Andrei Iancu
*Director of the United States Patent and Trademark Office*